United States Patent
Chen (10) Patent No.: US 6,235,582 B1
(45) Date of Patent: May 22, 2001

(54) METHOD FOR FORMING FLASH MEMORY CELL

(75) Inventor: Hwi-Huang Chen, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/223,613

(22) Filed: Dec. 30, 1998

(30) Foreign Application Priority Data

Oct. 26, 1998 (TW) .................................................. 87117658

(51) Int. Cl.[7] .............................................. H01L 21/8247
(52) U.S. Cl. ............................................ 438/257; 438/564
(58) Field of Search ............................. 438/564, 257–267

(56) References Cited

U.S. PATENT DOCUMENTS

| 4,124,934 | * | 11/1978 | De Brebisson . | |
|---|---|---|---|---|
| 5,597,741 | * | 1/1997 | Sakamoto et al. . | |
| 5,753,551 | * | 5/1998 | Sung | 438/253 |
| 5,773,346 | * | 6/1998 | Manning | 438/297 |
| 6,040,221 | * | 3/2000 | Manning | 438/297 |

* cited by examiner

Primary Examiner—Richard Booth
(74) Attorney, Agent, or Firm—Jiawei Huang; J. C. Patents (57) ABSTRACT

A method for forming a flash memory cell forms an insulating layer on a provided substrate and a number of openings are formed within the insulating layer to expose the substrate. A patterned conductive layer having a dopant is formed and fills the openings on the substrate. By driving the dopant into the substrate, source/drain regions are formed. A gate structure is formed on a channel region between the source/drain regions to accomplish the flash memory cell.

10 Claims, 10 Drawing Sheets

METHOD FOR FORMING FLASH MEMORY CELL

CROSS-REFERENCE TO RELATED APPLICATION

This application claims the priority benefit of Taiwan application Ser. No. 87117658, filed Oct. 26, 1998, the full disclosure of which is incorporated herein by reference.

BACKGROUND OF THE INVENTION

1. Field of the Invention

This invention relates in general to a method for forming a non-volatile memory device, and more specifically relates to a method for forming a flash memory.

2. Description of Related Art

Electrically erasable and programmable read only memory (EEPROM) is a widely used memory device in personal computers and electric devices. A conventional EEPROM has a floating gate to accomplish the function of erasing and programming the EEPROM. However, the EEPROM has a low access speed problem; typical access speed is about 150 ns to 200 ns. In response, Intel Corp. has developed a new EEPROM called flash memory, which has a high access speed about 70 ns to 80 ns.

Figure 1:
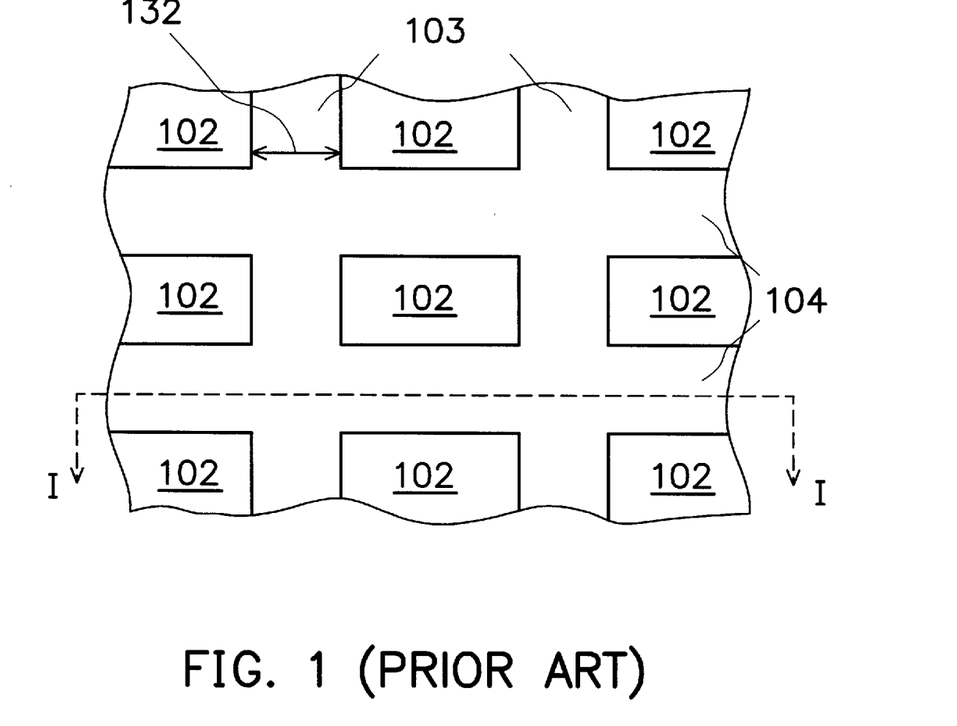
FIGS. 1 to 3 illustrate top views of a portion of manufacturing process for forming a flash memory cell by a conventional method.
Figure 1A:
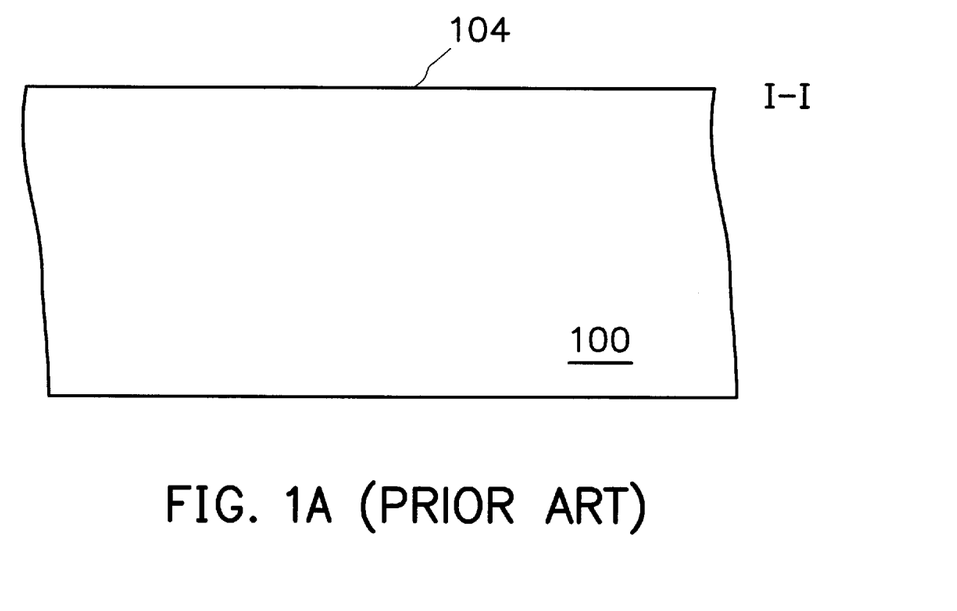
Figure 2:
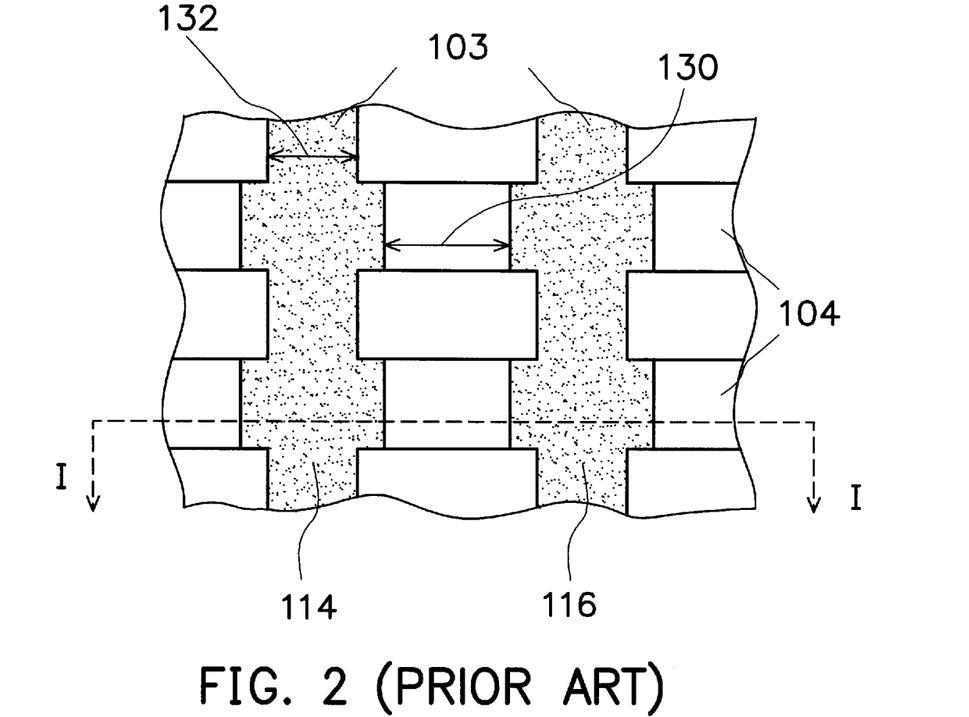
Figure 2A:
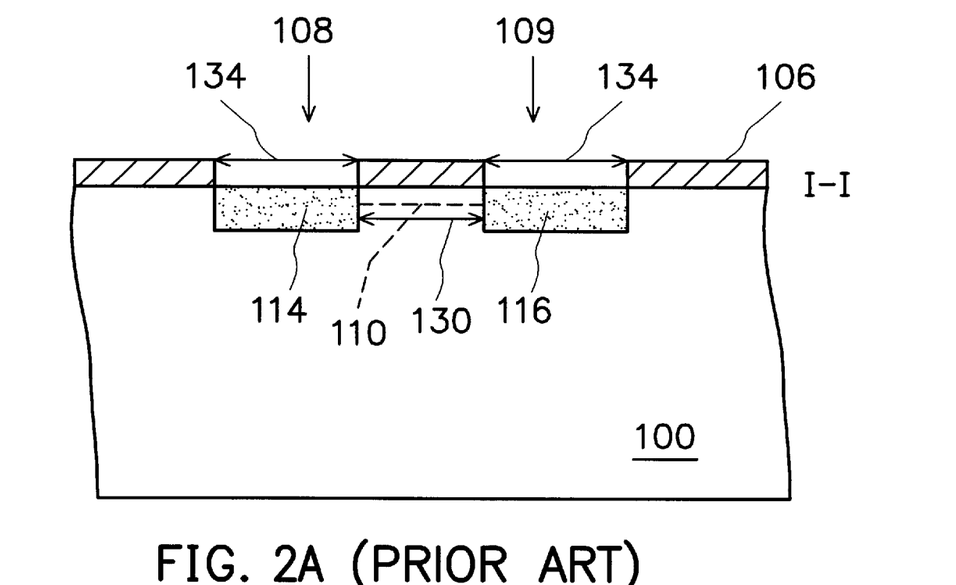
Figure 3:
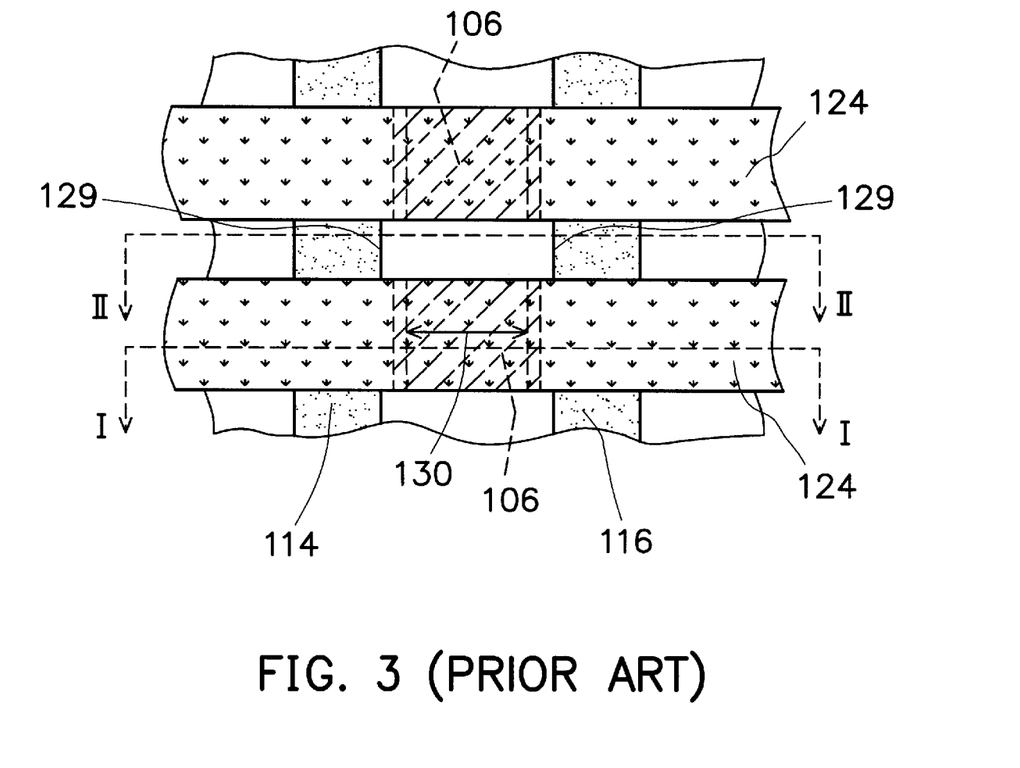

FIGS. 1 to 3 show top views of a portion of a manufacturing process for forming a flash memory cell by a conventional method. For clear description, cross-sectional views with respect to line I—I in individual FIGS. 1 to 3 are respectively shown in FIGS. 1A to 3A. FIG. 3B shows a cross-sectional view with respect to line II—II in FIG. 3.

Referring to FIG. 1 and FIG. 1A, a number of block field oxides 102 are formed by shallow trench isolation on a silicon substrate 100, by which column active regions 103 having a width 132 and row active regions 104 are defined.

Referring to FIG. 2 and FIG. 2A, a mask layer 106 which has openings 108, 109 with width 134 to expose the column active regions 103 and a portion of row active regions 104 is deposited on the substrate. An ion implantation process using the mask layer 106 as an etching mask is performed to form buried bit lines 114, 116 which also serve as the source/drain regions of the flash memory, and a channel region 110 is formed between the source/drain regions. It should be noted that the opening width 134 of the mask layer 106 must be greater than the width 132 of the column active regions 103 so that the buried bit lines 114, 116 can self-align to the column active regions 103 and have good conductive property. However, increasing the opening width 134 increases the width of buried bit lines 114, 116 so that the channel region length 130 is reduced which causes a short channel effect.

Figure 3A:
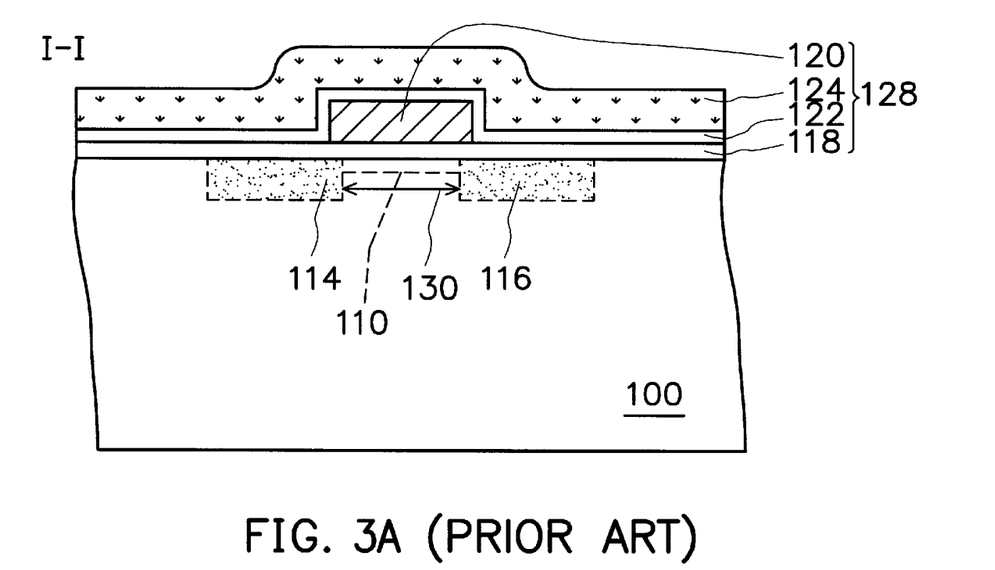
Figure 3B:
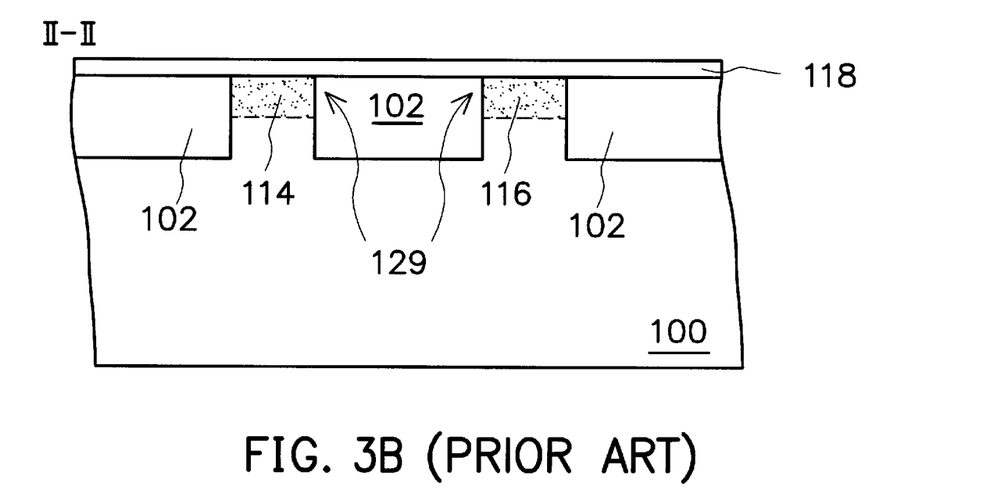
FIG. 3B is a cross-sectional view with respect to line II—II in FIG. 3.

Referring to FIG. 3 and FIG. 3A, a tunneling oxide 118 is deposited on the substrate 100 by thermal oxidation. A polysilicon floating gate 120, dielectric layer 122 and polysilicon controlling gate are sequentially formed on the tunneling oxide 118 to form a gate structure 128 of the flash memory.

FIG. 3B shows a cross-sectional view with respect to line II—II in FIG. 3. Sharp corners 129 are formed at the boundary between the block field oxide 102 and column active regions 114, 116 that usually cause a leakage current. The leakage current will damage the flash memory so that the yield is reduced.

According to the forging description, in order to solve the self-alignment problem, the buried bit line width must be greater than the column active region width, which reduces the channel length. In order not to reduce the channel length, it is necessary to increase the active region area, which will decrease the device integration. Furthermore, the block field oxide usually causes a leakage current which damages the flash memory so that the yield is reduced.

SUMMARY OF THE INVENTION

According to the foregoing description, an object of this invention is to provide a method for forming a flash memory cell, by which the source/drain region width does not restrict to the buried bit line alignment problem and the device integration increases.

Another object of this invention is to provide a method for forming a flash memory cell, by which a leakage current phenomenon is reduced and the yield is increased.

According to the objects mentioned above, a method for forming a flash memory cell is provided. A first and a second patterned conductive layers, each respectively having a dopant, are formed on a substrate. A portion of the dopant within the first patterned conductive layer is driven into the substrate to form a first source/drain region, and a portion of the dopant within the second patterned conductive layer is driven into the substrate to form a second source/drain region, wherein a channel region is formed between the first and the second source/drain regions. A gate structure of the flash memory cell is formed on the channel region. The gate comprises a tunneling oxide, a floating gate, a dielectric layer and a controlling gate which are formed on the channel region.

BRIEF DESCRIPTION OF THE DRAWINGS

While the specification concludes with claims particularly pointing out and distinctly claiming the subject matter which is regarded as the invention, the objects and features of the invention and further objects, features and advantages thereof will be better understood from the following description taken in connection with the accompanying drawings in which:

FIGS. 1A to 3A are cross-sectional views with respect to line I—I in FIGS. 1 to 3, respectively;

FIGS. 4A to 8A are schematic, cross-sectional views with respect to line III—III in FIGS. 4 to 8, respectively.

DESCRIPTION OF THE PREFERRED EMBODIMENT

FIGS. 4 through FIG. 8 schematically illustrate top views of a portion of a manufacturing process for forming a flash memory cell according to the preferred embodiment of this invention. For clear description, FIGS. 4A to FIG. 8A show the schematic, cross-sectional views with respect to the line III—III in FIGS. 4 to FIG. 8, respectively, and FIG. 8B shows the schematic, cross-sectional view with respect to line IV—IV in FIG. 8.

Figure 4:
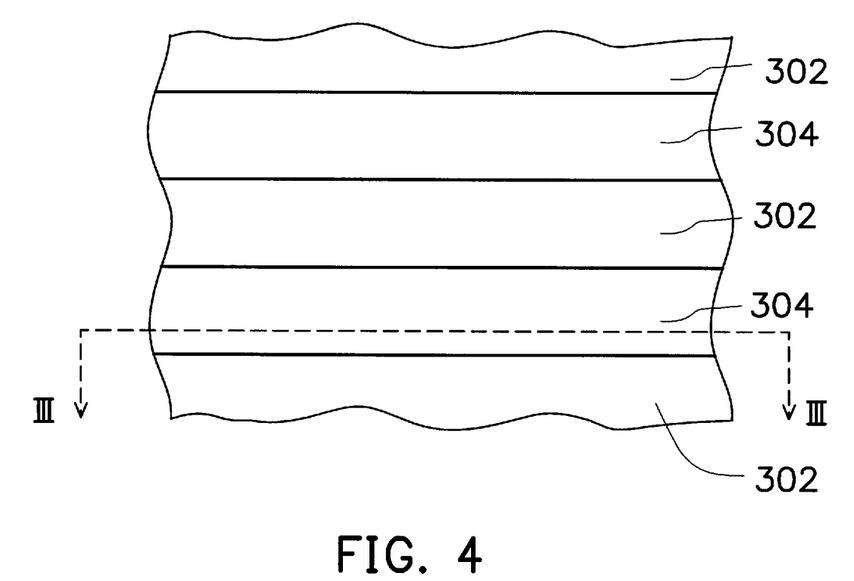
FIGS. 4 to 8 schematically illustrate top views of a portion of manufacturing process for forming a flash memory cell according to the preferred embodiment of this invention.
Figure 4A:
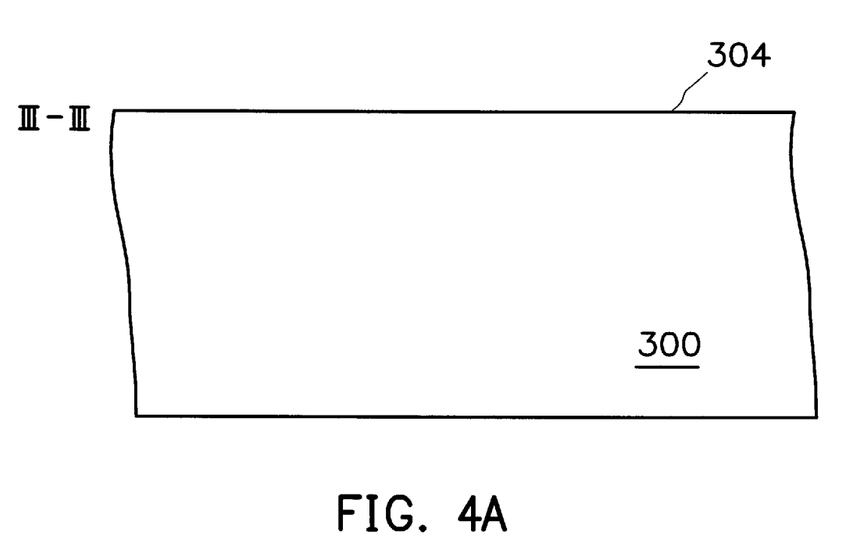

Referring to FIG. 4 and FIG. 4A, a number of field oxides 302, which can be strips, are formed on a substrate 300, and a number of active regions 304 are defined between the field oxides 302. Typically, the material of the substrate 300 includes silicon, such as silicon doped with p-type ions. The method for forming the field oxides 302 is, for example, shallow trench isolation (STI)

Figure 5:
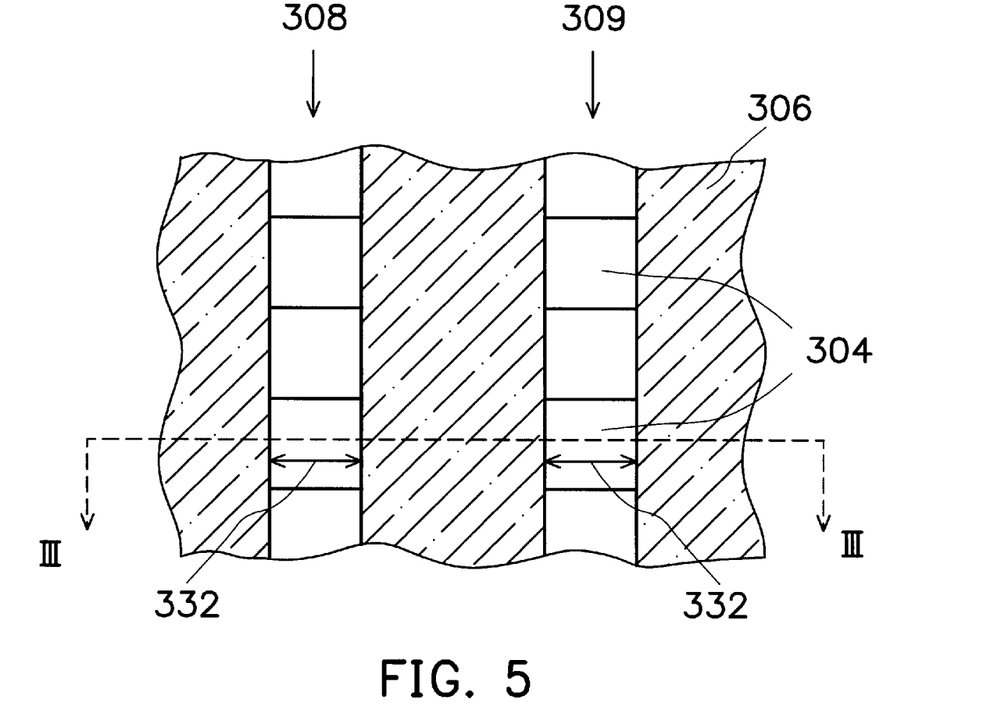
Figure 5A:
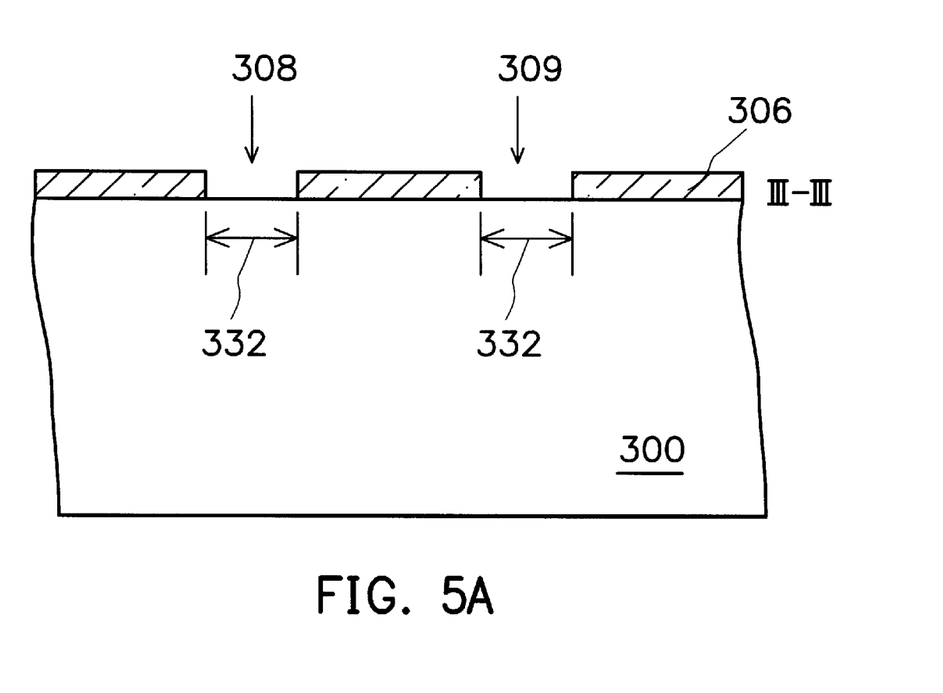

Referring to FIG. 5 and FIG. 5A, an insulating layer 306 is formed on the substrate 300. Openings 308 and 309 are formed within the insulating layer 306 to expose a portion of the substrate 300 which serves as a source/drain region. The material of the insulating layer 306 is, for example, silicon oxide and the typical method for forming the insulating layer 306 is chemical vapor deposition (CVD) or another, similar process. The exemplary method for forming the openings 308 and 309 is that a mask layer (not shown) serving as an etching mask is formed on the insulating layer 306 and the insulating layer 306 is etched to form the openings 308, 309.

A doped conductive layer (not shown) is formed on the whole substrate 300 and fills the openings 308 and 309.

Figure 6:
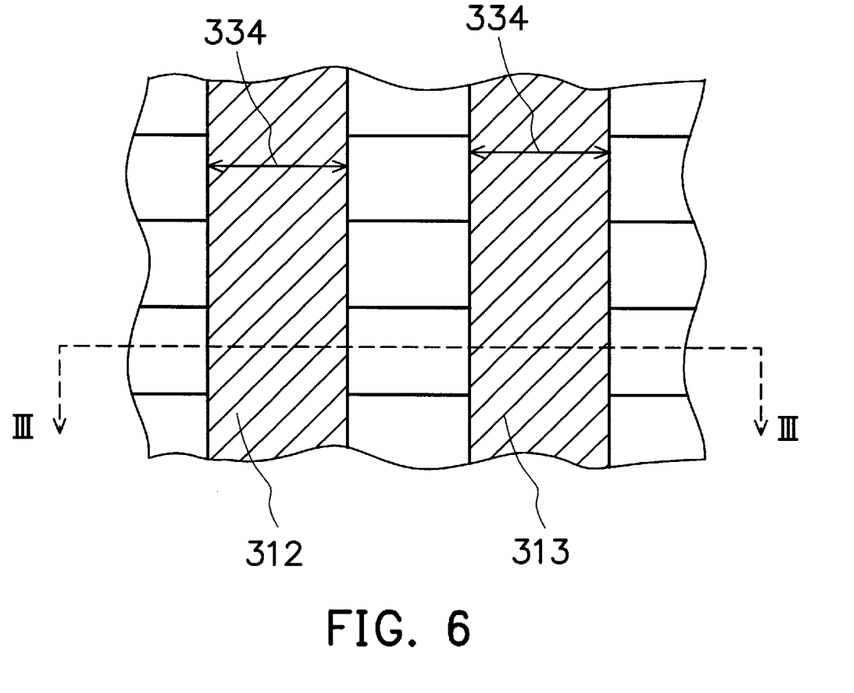
Figure 6A:
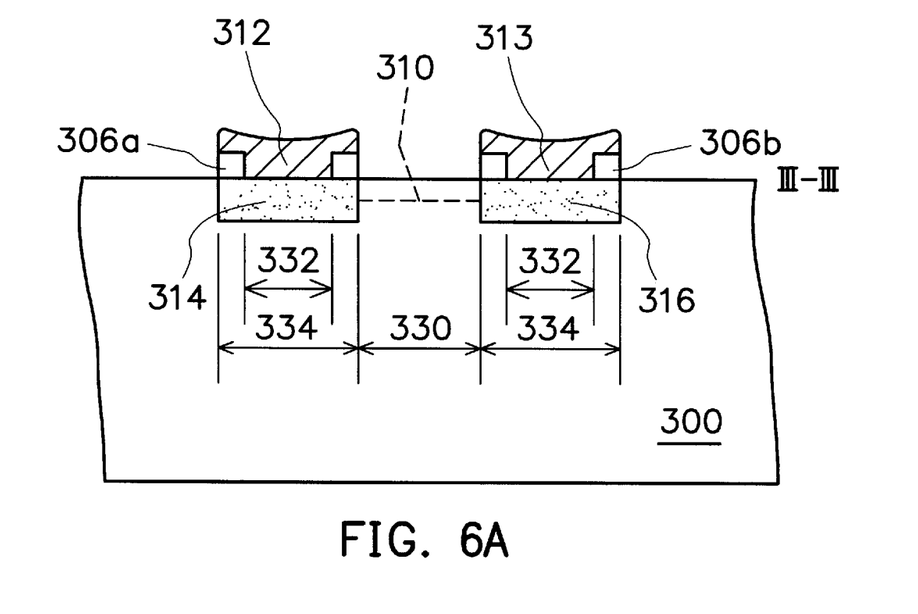

Referring to FIG. 6 and FIG. 6A, the doped conductive layer and the insulating layer 306 are patterned to form patterned conductive layers 312, 313 and insulating layers 306a, 306b, in which the widths 334 of the conductive layers 312, 313 are greater than the width 332 of the opening 308. The dopant within the conductive layers 312, 313 is driven into the substrate 300 to form the source/drain regions 314, 316 of a flash memory cell, wherein one of the conductive layers 312, 313 serves as the bit line of the flash memory. The flash memory cell has a channel region 310 with length 330.

For example, the material of the conductive layers 312, 313 is polysilicon and the dopant within the conductive layer 312, 313 is an N-type ion, such as phosphorus. The method for forming the doped conductive layer is to form a conductive layer by CVD or a similar method, and then to implant the dopant into the conductive layer. Otherwise, the dopant can be implanted at the same time as the conductive is being formed. A patterned mask layer serving as an etching mask is formed on the doped conductive layer and the doped conductive layer is etched to form patterned conductive layers 312, 313 and the patterned insulating layers 306a, 306b. By performing an annealing process, the dopant within the conductive layers 312, 313 is driven into the substrate 300 to form the source/drain regions 314, 316, of which the widths are equal to the width 322 of the openings 308, 309.

It should be noted that the source/drain regions 314, 316 are formed by a hot driving method after the bit line is formed, by which no additional process is needed. Therefore, the alignment problem between the bit line and the active region, which usually happens in conventional methods, is eliminated. As a result, it is not necessary to enlarge the width of the source/drain regions to solve the alignment problem so that the width of the source/drain regions can be significantly reduced and benefit a high device integration.

Figure 7:
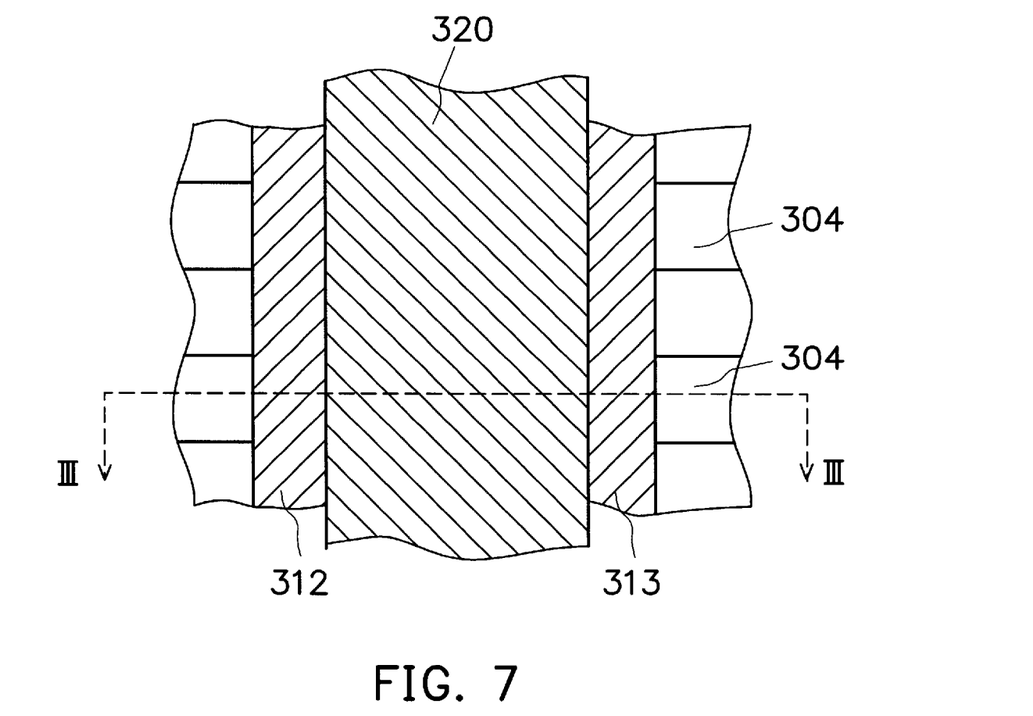
Figure 7A:
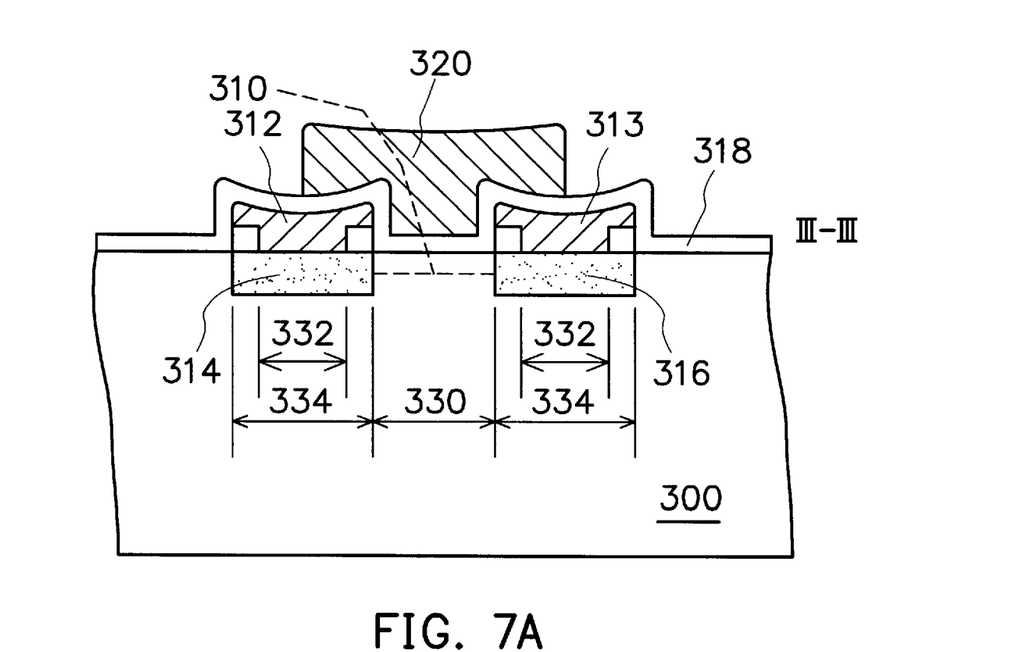

Referring to FIG. 7 and FIG. 7A, a tunneling oxide 318, of which a preferred thickness is about between 60 Å and 120 Å in order to let hot electrons tunnel through the tunneling oxide 318 while programming or erasing the flash memory cell, and a conductive layer (not shown), of which a preferred thickness is about between 800 Å and 2000 Å, are sequentially formed on the substrate 300. The conductive layer is patterned to form a floating gate 320 of the flash memory cell. The exemplary method for forming the tunneling oxide 318 is thermal oxidation. The exemplary method for forming the conductive layer 320 is to form a polysilicon layer is formed by CVD and then to implant the dopant into the polysilicon to increase the conductivity of the polysilicon layer. Typically, the dopant is phosphorus and the energy for ion implantation is about 20 to 50 KeV with a dopant dosage around $10^{14}$ to $10^{15}$ atoms/cm$^2$. Another method for forming the conductive layer 320 is to implant the dopant at the same time as the polysilicon layer is being formed.

Figure 8:
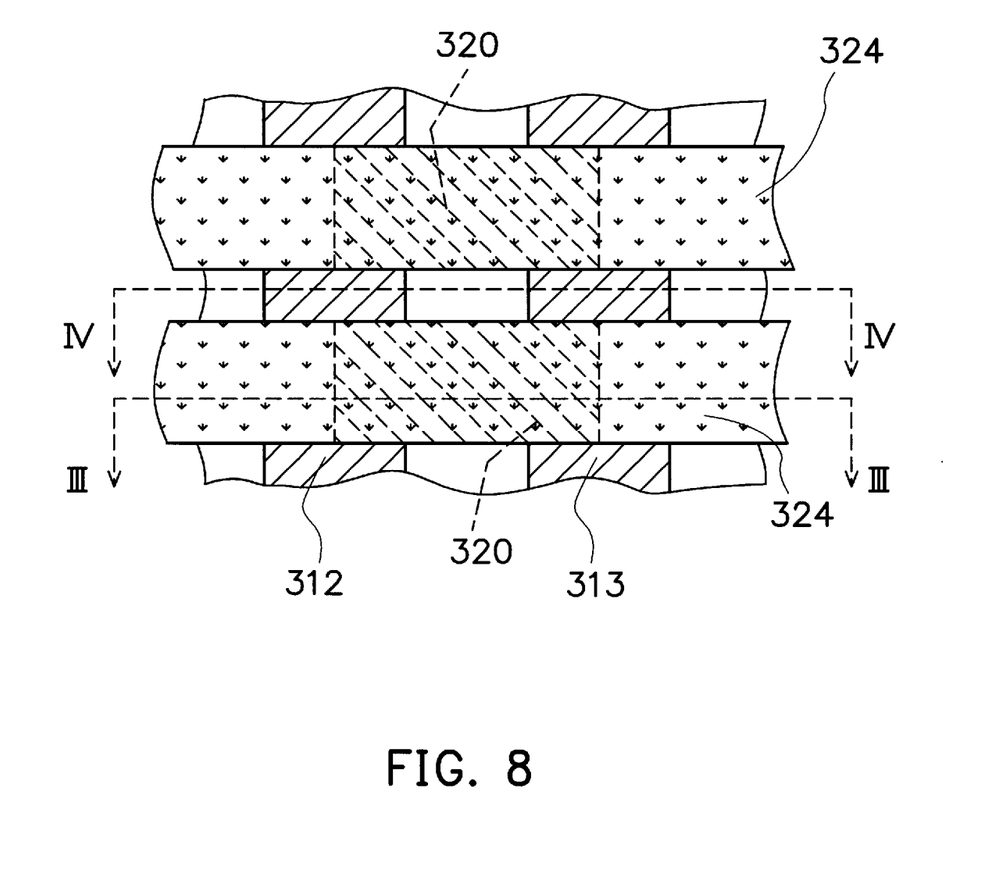
Figure 8A:
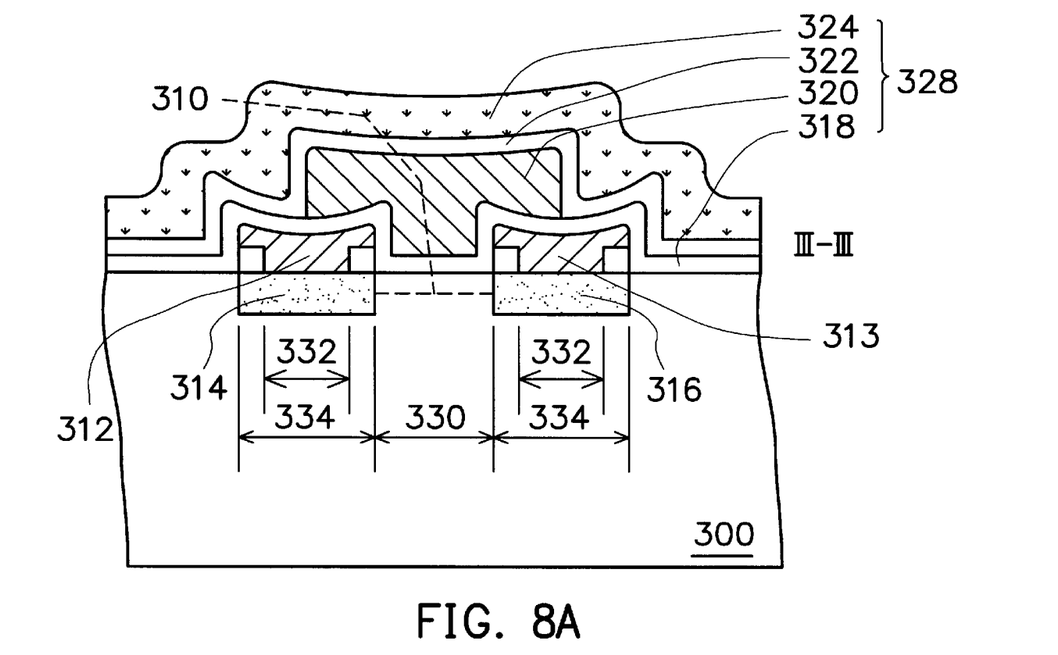
Figure 8B:
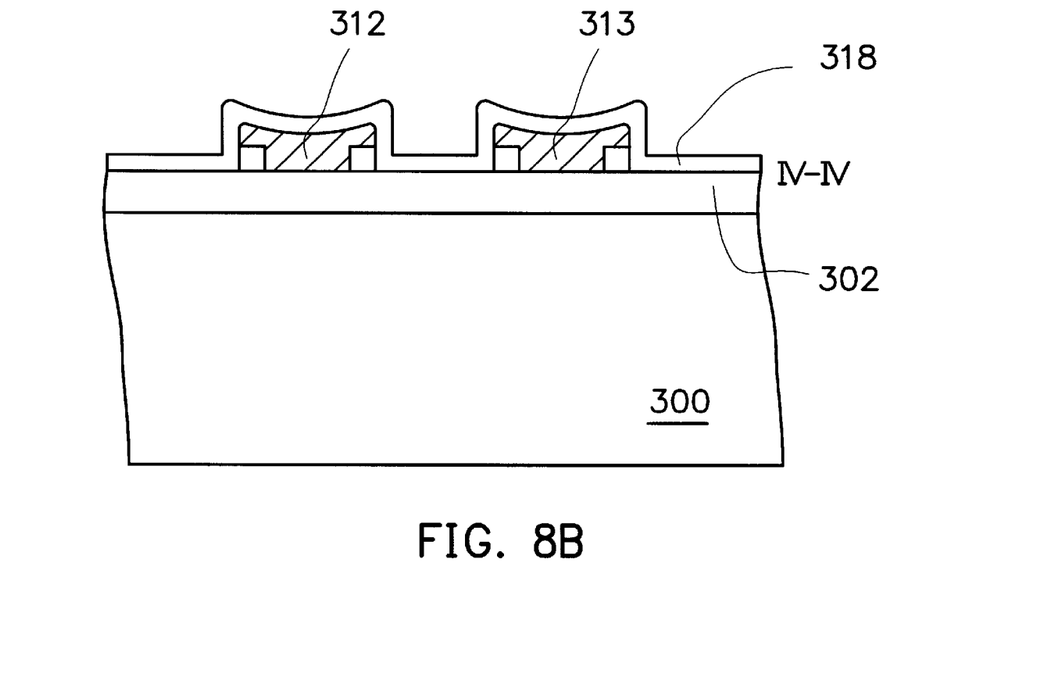
FIG. 8B is a schematic, cross-sectional view with respect to line IV—IV in FIG. 8.

Referring to FIG. 8 and FIG. 8A, a dielectric layer 322 and a conductive layer 324 serving as the controlling gate of the flash memory cell are formed on the substrate 300. The controlling gate 324, dielectric layer 322, the floating gate 320 and the tunneling oxide 318 construct a gate structure of the flash memory cell. The exemplary material of the dielectric layer 322, which is used to isolate the controlling gate 324 and the floating gate 320, is silicon oxide/silicon nitride/silicon oxide (ONO) and the thickness of the dielectric layer 322 is about 120 Å to 250 Å. The material of the conductive layer 324, for example, is doped polysilicon and the thickness of the conductive layer 324 is about 1000 Å to 2000 Å. Typically, the dopant is phosphorus and the energy for ion implantation is about 20 to 50 KeV with a dopant dosage around $10^{15}$ to $10^{16}$ atoms/cm$^2$.

FIG. 8B illustrates the cross-sectional view with respect to the line IV—IV in FIG. 8. According to this invention, the field oxide 302 is strip-shaped so that there are no sharp corners at the boundary between the field oxide 302 and the active region 304, as usually happens in the conventional methods.

A feature of this invention is that the source/drain regions are formed at the same time as the bit line is being formed. Therefore, there is no alignment problem between the bit line and the active region, which usually happens in the conventional methods. According to this invention it is not necessary to enlarge the width of the source/drain regions to solve the alignment problem, so that the widths of the source/drain regions can be reduced and benefit a high device integration.

Another feature of this invention is that the field oxide is strip-shaped rather than block-shaped in the conventional methods. As a result, no sharp corners occur at the boundary between the block field oxide and the column active region. Leakage current is significantly reduced and the yield is increased.

While the present invention has been described with a preferred embodiment, this description is not intended to limit the invention. Various modifications of the embodiment will be apparent to those skilled in the art. It is therefore contemplated that the appended claims will cover any such modifications or embodiments as fall within the true scope of the invention.

What claimed is:

1. A method for forming a flash memory cell, comprising the steps of:
   providing a substrate;
   respectively forming a first and a second patterned conductive layer having a dopant on the substrate;
   driving a portion of the dopant within the first patterned conductive layer into the substrate to form a first source/drain region and driving a portion of the dopant within the second patterned conductive layer into the substrate to form a second source/drain region, wherein a channel region is formed between the first and the second source/drain regions; and
   forming a gate structure of the flash memory cell on the channel region.

2. The method of claim 1, wherein the step of forming the first and the second patterned conductive layers further comprises the steps of:

forming an insulating layer on the substrate;

forming a first and a second openings inside the insulating layer to expose the substrate; and     respectively forming the first and the second patterned conductive layers having the dopant on the substrate, and     filling the first opening with the first patterned conductive layer and filling the second opening with the second patterned conductive layer.

3. The method of claim 2, wherein the dopant includes an N-type dopant.

4. The method of claim 2, wherein the material of the first and the second patterned conductive layers include a polysilicon having the dopant.

5. The method of claim 2, wherein the step of forming the gate structure further comprises a step of sequentially forming a tunneling oxide, a floating gate, a dielectric layer and a controlling gate on the channel region.

6. The method of claim 2, wherein the step of driving the dopant into the substrate includes an annealing process.

7. The method of claim 1, wherein the dopant includes N-type dopant.

8. The method of claim 1, wherein the material of the first and the second patterned conductive layers includes a polysilicon having the dopant.

9. The method of claim 1, wherein the step of forming the gate structure further comprises a step of sequentially forming a tunneling oxide, a floating gate, a dielectric layer and a controlling gate on the channel region.

10. The method of claim 1, wherein the step of driving the dopant into the substrate includes an annealing process.

* * * * *